United States Patent
Hirai

(10) Patent No.: US 8,310,287 B2
(45) Date of Patent: Nov. 13, 2012

(54) RESET CIRCUIT AND CONTROL APPARATUS INCLUDING THE RESET CIRCUIT

(75) Inventor: Masaru Hirai, Tokyo (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 0 days.

(21) Appl. No.: 13/187,761

(22) Filed: Jul. 21, 2011

(65) Prior Publication Data

US 2012/0019291 A1    Jan. 26, 2012

(30) Foreign Application Priority Data

Jul. 26, 2010  (JP) ................... 2010-166955

(51) Int. Cl.
*H03L 7/00* (2006.01)
(52) U.S. Cl. .............. 327/143; 327/77; 327/81
(58) Field of Classification Search .......... 327/77, 327/78, 80, 81, 142, 143, 198
See application file for complete search history.

(56) References Cited

U.S. PATENT DOCUMENTS

| | | | |
|---|---|---|---|
| 7,034,581 B2* | 4/2006 | Sudou | 327/77 |
| 2009/0219066 A1* | 9/2009 | Shkidt | 327/143 |

FOREIGN PATENT DOCUMENTS

JP    2001-141761    5/2001

* cited by examiner

*Primary Examiner* — Long Nguyen
(74) *Attorney, Agent, or Firm* — IPUSA, PLLC

(57) ABSTRACT

A reset circuit for resetting and terminating the resetting of a reset target includes an n-channel metal-oxide-semiconductor field-effect transistor (MOSFET), a gate drive circuit configured to switch a drain voltage of the n-channel MOSFET from a low level to a high level when a power supply voltage exceeds a predetermined threshold, a sink circuit configured to maintain the drain voltage at the low level by sinking a current flowing from a drain side of the n-channel MOSFET to the sink circuit, and a block circuit configured to block the current sinking to the sink circuit when the power supply voltage exceeds the predetermined threshold. The low level indicates a state where the reset target is in a reset state and the high level indicates a state where the reset state of the reset target is terminated.

6 Claims, 6 Drawing Sheets

FIG.4

| | $0<VDD<VL(<Vth)$ | $VDD<Vth$ $(Vc<Vref)$ | $VDD>Vth$ $(Vc>Vref)$ |
|---|---|---|---|
| N0 | OFF | ON | OFF |
| P1 | OFF | OFF | ON |
| N1 | ON | ON | OFF |
| POR | L | L | H |

RESET CIRCUIT AND CONTROL APPARATUS INCLUDING THE RESET CIRCUIT

BACKGROUND OF THE INVENTION

1. Field of the Invention

The present invention generally relates to a reset circuit and a control apparatus including the reset circuit.

2. Description of the Related Art

As one related art example, there is known a power-on reset circuit that terminates outputting of a reset signal when the voltage of a power source is detected to exceed a predetermined threshold. As one example of the power-on reset circuit, FIG. 1 illustrates a reset circuit 1 having an open drain output. In a case of the reset circuit 1, a comparator C1 outputs a high level gate drive signal VG when a divided voltage Vc (obtained by dividing a power supply voltage VDD with resistors R1, R2, and R3) is lower than a reference voltage Vref. Accordingly, because the reset circuit 1 switches on a transistor N0 by outputting the high level gate drive signal VG, the reset circuit 1 switches the voltage level POR of an output terminal 13 to a low level. On the other hand, the reset circuit 1 outputs a low level gate drive signal VG when the divided voltage Vc is higher than the reference voltage Vref. Accordingly, because the reset circuit 1 switches off the transistor N0 by outputting the low level gate drive signal VG, the reset circuit 1 switches the voltage level POR of the output terminal 13 to a high level.

In other words, in the case of the reset circuit 1 illustrated in FIG. 1, the voltage level POR is switched to a low level when the status of the voltage of the power source (power supply voltage) VDD becomes a low voltage state that requires an external apparatus (not illustrated) to be reset, and the voltage level POR is switched to a high level when the status of the voltage of the power supply voltage VDD becomes a steady voltage state that allows the resetting of the external apparatus to be terminated.

For example, Japanese Laid-Open Patent Publication No. 2001-141761 discloses a reset circuit according to a related art example.

With the reset circuit illustrated in FIG. 1, the comparator C1, which uses the power supply voltage VDD as a power source for operation, is unable to output a voltage sufficient to switch on the transistor N0 when the power supply voltage VDD is in an ultra-low voltage state being slightly larger than 0 (zero) V. Thus, because the transistor N0 is unable to acquire electric current, the voltage level POR of the output terminal 13 becomes a high level.

In recent years, however, the operating voltage (voltage for operating) of control circuits (e.g., microcomputers) is becoming lower. Therefore, even if the power supply voltage VDD is in the ultra-low voltage state where the resetting of the power source voltage should not be allowed, a control circuit may determine that the resetting is terminated when the voltage level POR becomes a high level.

Because the circuit disclosed in Japanese Laid-Open Patent Publication No. 2001-141761 is used for a case of CMOS output, the circuit of Japanese Laid-Open Patent Publication No. 2001-141761, being capable of switching the voltage of an output terminal even where the power supply voltage VDD is in the ultra-low voltage state, cannot be applied to the reset circuit 1 of FIG. 1 having the open drain output.

SUMMARY OF THE INVENTION

The present invention provides a reset circuit and a control apparatus including the reset circuit that substantially eliminate one or more of the problems caused by the limitations and disadvantages of the related art.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by a reset circuit and a control apparatus including the reset circuit particularly pointed out in the specification in such full, clear, concise, and exact terms as to enable a person having ordinary skill in the art to practice the invention.

To achieve these and other advantages and in accordance with the purpose of the invention, as embodied and broadly described herein, an embodiment of the present invention provides a reset circuit for resetting and terminating the resetting of a reset target includes an n-channel metal-oxide-semiconductor field-effect transistor (MOSFET), a gate drive circuit configured to switch a drain voltage of the n-channel MOSFET from a low level to a high level when a power supply voltage exceeds a predetermined threshold, a sink circuit configured to maintain the drain voltage at the low level by sinking a current flowing from a drain side of the n-channel MOSFET to the sink circuit, and a block circuit configured to block the current sinking to the sink circuit when the power supply voltage exceeds the predetermined threshold. The low level indicates a state where the reset target is in a reset state and the high level indicates a state where the reset state of the reset target is terminated.

Other objects and further features of the present invention will be apparent from the following detailed description when read in conjunction with the accompanying drawings.

BRIEF DESCRIPTION OF THE DRAWINGS

FIG. 4 is a table for describing a relationship of a voltage state of a power supply voltage VDD, an on/off state of transistors N0, P1, and N1, and a high/low state of a voltage level POR according to an embodiment of the present invention;

DESCRIPTION OF THE PREFERRED EMBODIMENTS

In the following, embodiments of the present invention will be described with reference to the accompanying drawings.

First Embodiment

Figure 2:
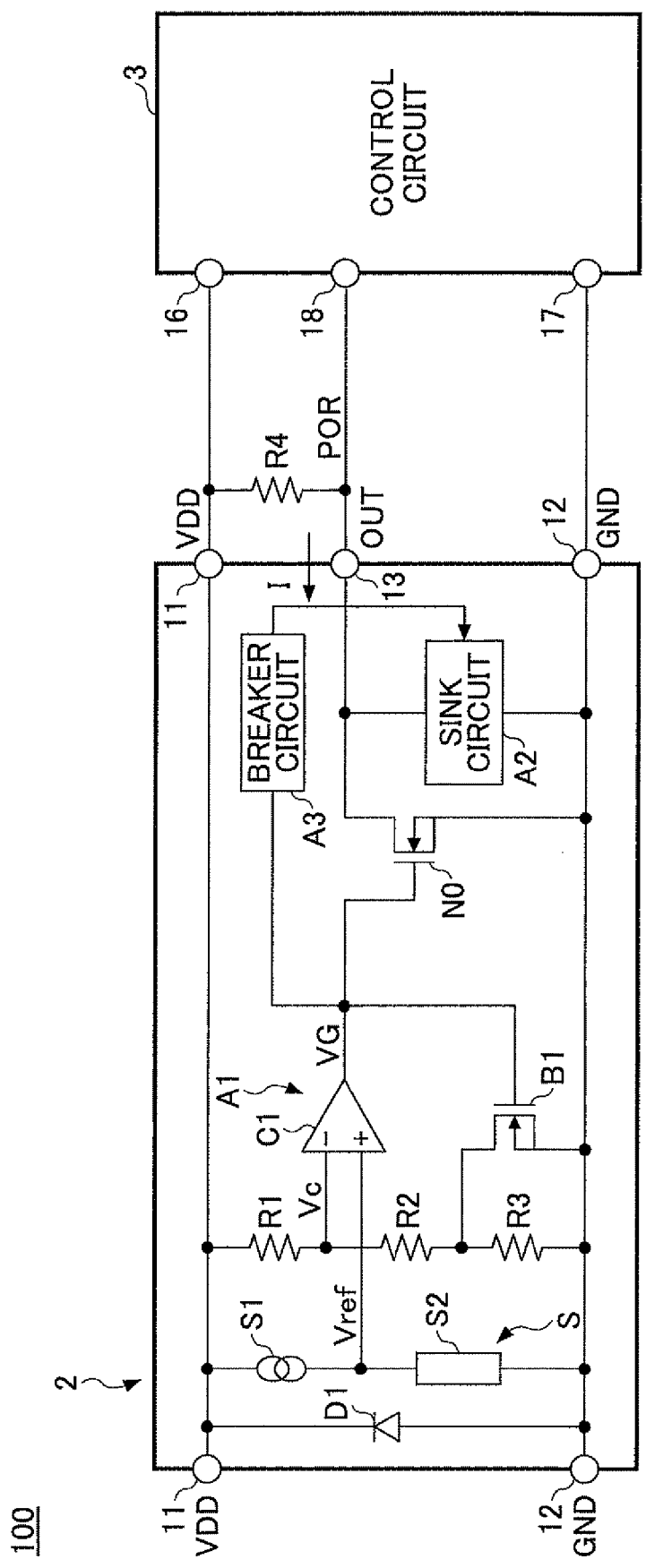
FIG. 2 is a schematic diagram illustrating an exemplary configuration of a control apparatus according to an embodiment of the present invention.

FIG. 2 is a schematic diagram illustrating a control apparatus 100 according to an embodiment of the present invention. The control apparatus 100 is a system circuit that includes a reset circuit 2 and a control circuit 3 (reset target). The reset circuit 2 and the control circuit 3 may be an SOC (System On a Chip) integrated circuit. The reset circuit 2 controls the resetting of the control circuit 3 and the terminating of the resetting. One example of the control circuit 3 is a CPU (Central Processing Unit). One example of the control apparatus 100 is a microcomputer having the control circuit 3 installed and using the control circuit 3 as a CPU.

The reset circuit 2 has a function of maintaining the voltage level POR at a low level in a case where the voltage status of the power supply voltage VDD is at a predetermined low voltage state. The predetermined low voltage state is, for example, where the power supply voltage VDD is in a low voltage state when a surrounding circuit such as the control circuit 3 is to be reset. The reset circuit 2 further has a function of maintaining the voltage level POR at a high level in a case where the voltage status of the power supply voltage VDD is at a predetermined high voltage state. The predetermined high voltage state is, for example, where the power supply voltage VDD is in a steady voltage state when the resetting of a surrounding circuit such as the control circuit 3 is to be terminated.

A voltage control circuit such as a regulator (not illustrated) controls the power supply voltage VDD so that the power supply voltage VDD matches a predetermined target voltage. At a rising phase of the power supply voltage VDD, the power supply voltage VDD is slightly lower than the target voltage. In this state, the reset circuit 2 shifts from a resetting mode to a reset terminating mode when the voltage level POR of an output terminal 13 of the reset circuit 2 is switched from a low level to a high level. Likewise, at a falling phase of the power supply voltage VDD, the power supply voltage VDD is slightly lower than the target voltage. In this state, the reset circuit 2 shifts from a reset terminating mode to a resetting mode when the voltage level POR of the output terminal 13 of the reset circuit 2 is switched from a high level to a low level.

The reset circuit 2 includes, for example, a transistor N0, a gate drive circuit A1, a sink circuit A2, and a block circuit A3.

The transistor N0 is, for example, an enhancement type metal-oxide-semiconductor field-effect transistor (MOSFET). The transistor N0 has an open drain output. The transistor N0 is a source ground circuit used as an output part of the reset circuit 2. In this embodiment, a resistor R4, being connected to the outside of the reset circuit 2, is inserted between the output terminal 13 (to be connected to the drain of the transistor N0) and a power supply terminal 11 of the power supply voltage VDD. As long as the resistor R4 is inserted between the drain of the transistor N0 and the power supply voltage VDD, the resistor R4 may be connected in a different manner. For example, the resistor R4 may be installed in the control circuit 3 or installed in the reset circuit 2.

When the power supply voltage VDD exceeds a predetermined threshold Vth, the gate drive circuit A1 switches the voltage level POR of the output terminal 13 (i.e. drain voltage of the transistor N0) from a low level (indicating a reset state) to a high level (indicating a reset terminated state) by switching the transistor N0 from an ON state to an OFF state. The predetermined threshold Vth of the power supply voltage VDD is a value in which the control circuit 3 is to be reset. The gate drive circuit A1 switches off the transistor N0 by outputting a low level gate drive signal VG to a gate of the transistor N0. The gate drive circuit A1 switches on the transistor N0 by outputting a high level gate drive signal VG to the gate of the transistor N0. The gate drive circuit A1 uses the power supply voltage VDD as a power supply voltage for operating.

The gate drive circuit A1 includes, for example, a comparator C1 using the power supply voltage VDD for operating. The comparator C1 is a circuit that compares the power supply voltage VDD and the threshold Vth. According to the result of the comparison, the comparator C1 switches the voltage level of the gate drive signal VG to a high level or a low level.

The sink circuit A2 maintains the voltage level FOR of the drain voltage of the transistor N0 at a low level by sinking the current I flowing in the output terminal 13 on a drain side of the transistor N0. The current I flows into the sink circuit A2 via the resistor R4.

In a case where the threshold Vth is higher than the power supply voltage VDD, the block circuit A3 terminates maintaining the voltage level FOR at a low level by blocking the current I sinking into the sink circuit A2.

The power supply terminal 11 of the reset circuit 2 is connected to a power supply terminal 16 of the control circuit 3. The output terminal 13 of the reset circuit 2 is connected to a reset input terminal 18 of the control circuit 3. A ground terminal 12 of the reset circuit 2 is connected to a ground terminal 17 of the control circuit 3.

With the above-described embodiment of the reset circuit 2, the sink circuit A2 forces the drain of the transistor N0 to maintain a low voltage level POR even in a case where the transistor N0 is switched off due to an ultra-low voltage state of the power supply voltage VDD. Thereby, the voltage level POR can be prevented from being switched to a high level. As a result, in a case where the power supply voltage VDD is in a state where the resetting of the control circuit 3 is not to be terminated, the control circuit 3 can be prevented from erroneously determining that the resetting is terminated. Further, in a case where the power supply voltage VDD is higher than the threshold Vth, the current I sinking into the sinking circuit A2 is broken off by the block circuit A3, and the transistor N0 is switched off according to the low level gate drive signal VG. Furthermore, because the voltage level POR is switched to a high level, the control circuit 3 can be prevented from being maintained at a reset state in a case where the power supply voltage VDD is in a state where the reset state of the control circuit 3 is to be terminated.

Figure 3:
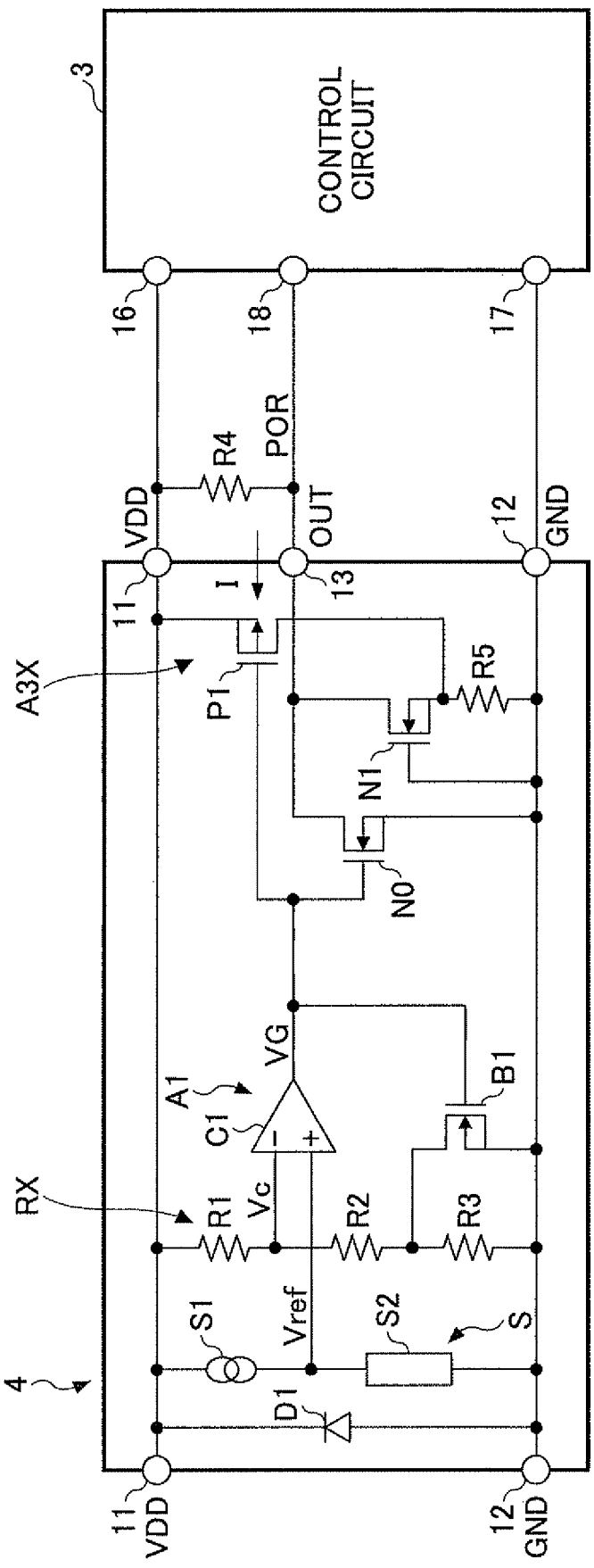
FIG. 3 is a schematic diagram illustrating a control apparatus including a reset circuit according to an embodiment of the present invention.

Next, a detailed example of the reset circuit 2 is described with reference to FIG. 3. FIG. 3 illustrates a control apparatus 200 including a reset circuit 4 according to an embodiment of the present invention. In FIG. 3, like elements are denoted with like reference numerals as those of FIG. 2 and are not further described.

A gate drive circuit A1 includes a resistance voltage divider circuit Rx, a comparator C1, and a reference voltage generation circuit S1 that generates a reference voltage Vref.

The resistance voltage divider circuit Rx monitors the power supply voltage VDD (monitor circuit). In this embodiment, the resistance voltage divider circuit Rx is a series circuit including resistors R1, R2, and R3 connected in series. The resistance voltage divider circuit Rx is connected between a ground pattern connected to the ground terminal 12 and a power supply pattern connected to the power supply terminal 11. The resistance voltage divider circuit Rx outputs a detection voltage Vc from a junction point between the resistor R1 and the resistor R2. The resistance voltage divider circuit Rx generates the detection voltage Vc by dividing the power supply voltage VDD. In other words, the value of the detection voltage Vc differs in accordance with the value of the power supply voltage VDD.

Because a transistor B1 is switched off when the voltage (gate drive signal VG) output from the comparator C1 is a low level, the resistance voltage divider circuit Rx outputs the detection voltage Vc by dividing the power supply voltage VDD with the resistors R1, R2, R3. Because the transistor B1 is switched on when the voltage (gate drive signal VG) output from the comparator C1 is a high level, the resistance voltage divider circuit Rx outputs the detection voltage Vc by dividing the power supply voltage VDD with the resistors R1 and R2. Accordingly, the detection voltage Vc can attain hysteresis.

The detection voltage Vc and the reference voltage Vref are input to the comparator C1 for comparison. The comparator C1 outputs a gate drive signal VG in accordance with the result of the comparison between the detection voltage Vc and the reference voltage Vref. The reference voltage Vref is a constant voltage value generated by stepping down the power supply voltage VDD with a reference voltage generation circuit S (circuit that generates the reference voltage Vref). The reference voltage Vref is input to a non-inverting input terminal of the comparator C1. The detection voltage Vc is input to an inverting input terminal of the comparator C1. Accordingly, in a case where the comparator C1 determines that the detection voltage Vc does not exceed the reference voltage Vref, the comparator C1 outputs a high level gate drive signal VG. In a case where the comparator C1 determines that the detection voltage Vc exceeds the reference voltage Vref, the comparator C1 outputs a low level gate drive signal VG.

The reference voltage generation circuit S generates a constant reference voltage Vref that is lower than the power supply voltage VDD by allowing a current to flow from a constant power supply S1 to a reference voltage generation element S2. The constant power supply S1 may be, for example, a depletion type MOSFET including a drain connected to the power supply voltage VDD. In addition, the depletion type MOSFET may also include a gate and a source short-circuited therebetween. The reference voltage generation element S2 may be, for example, a depletion type MOSFET connected to a diode.

Further, the reset circuit 4 includes a transistor N1 which is used as the sink circuit A2 illustrated in FIG. 2. The transistor N1 may be, for example, a depletion type N-channel MOSFET having a gate and a source that are short-circuited via a resistor R5. The gate of the transistor N1 is connected to ground (GND). Accordingly, the gate voltage of the transistor N1, which is the reference of the source of the transistor N1, can become 0 (zero). Because the gate voltage of the transistor N1, which is the reference of the source of the transistor N1 is 0 and the drain of the transistor N1 is connected to a drain of a transistor N0, the transistor N1 can substantially constantly sink the current I flowing to the drain side of the transistor N0 unless the current I is blocked by the below-described block circuit A3. Therefore, even in a case where, for example, the power supply voltage VDD is in an ultra-low voltage state, the transistor N1 can substantially constantly sink the current I flowing to the drain side of the transistor N0 unless the current I is blocked by the below-described block circuit A3.

In the reset circuit 4 illustrated in FIG. 3, a block circuit A3X is used as the block circuit A3 illustrated in FIG. 2. The block circuit A3X includes a transistor P1 and a resistor R5. In accordance with a low level gate drive signal VG output from the comparator C1, the transistor P1 increases the potential of the source of the transistor N1 until the potential reaches the power supply voltage VDD. Thereby, the voltage between the drain and source of the transistor N1 becomes approximately 0 V. Accordingly, the transistor N1 can block the sinking of the current I. The gate of the transistor P1 is connected to the output terminal of the comparator C1 and the gate of the transistor N0. Therefore, a gate drive signal VG can be input to the gate of the transistor P1. The source of the transistor P1 is connected to the power supply voltage VDD. The drain of the transistor P1 is connected between the source of the transistor N1 and the resistor R5. The resistor R5 is inserted between the source and ground of the transistor N1.

FIG. 4 is a table for describing a relationship of a voltage state of a power supply voltage VDD, an on/off state of transistors N0, P1, and N1, and a high/low state of a voltage level POR according to an embodiment of the present invention.

In a case where the power supply voltage VDD is in an ultra-low voltage state being lower than voltage VL, the least operating voltage of the comparator C1 (least voltage for the comparator C1 to operate) is lower than the power source voltage VDD. Therefore, the output voltage of the comparator C1, which uses the power supply voltage VDD as an operating voltage, is lower than a threshold of the gate voltage that can switch on the transistor N0. Accordingly, in a case where the power supply voltage VDD is in an ultra-low voltage state, the transistor N0 is switched off. Due to the ultra-low voltage state of the power supply voltage VDD, the potential difference between the gate of the transistor P1 and the source of the transistor P1 is less than the threshold of the gate voltage that can switch on the transistor P1. Accordingly, because the current I sinks into the sink circuit by switching on the transistor N1, the voltage level POR becomes a low level.

In a case where the power supply voltage VDD is greater than the voltage VL and is in a low voltage state being equal to or less than the threshold Vth, the power supply voltage VDD exceeds the least operating voltage of the comparator C1 (least voltage for the comparator C1 to operate). Further, in a case where the power supply voltage VDD is in the low voltage state, the detection voltage Vc is less than the reference voltage Vref. Accordingly, because the voltage level of the gate drive signal VG is a high level, the transistor N0 is switched on. Due to the high level of the voltage level of the gate drive signal Vg, the potential difference between the gate of the transistor P1 and the source of the transistor P1 is less than the threshold of the gate voltage that can switch on the transistor P1. Accordingly, in the case where the power supply voltage VDD is in a low voltage state, the voltage level POR becomes a low level due to the current I sinking into the sink circuit by switching on the transistor N1, the voltage level POR becomes a low level.

In a case where the power supply voltage VDD is in a steady voltage state exceeding the threshold, the detection voltage Vc is greater than the reference voltage Vref. Because the voltage level of the gate drive signal VG is a low level, the transistor N0 is switched off. Due to the low level of the voltage level of the gate drive signal VG, the potential difference between the gate of the transistor P1 and the source of the transistor P1 exceeds the threshold of the gate voltage that can switch on the transistor P1. Therefore, the transistor P1 is switched on. By switching on the transistor P1, the transistor N1 is switched off. Accordingly, the sinking of the current I by the transistor N1 can be blocked. Accordingly, the voltage level POR becomes a high level.

Figure 1:
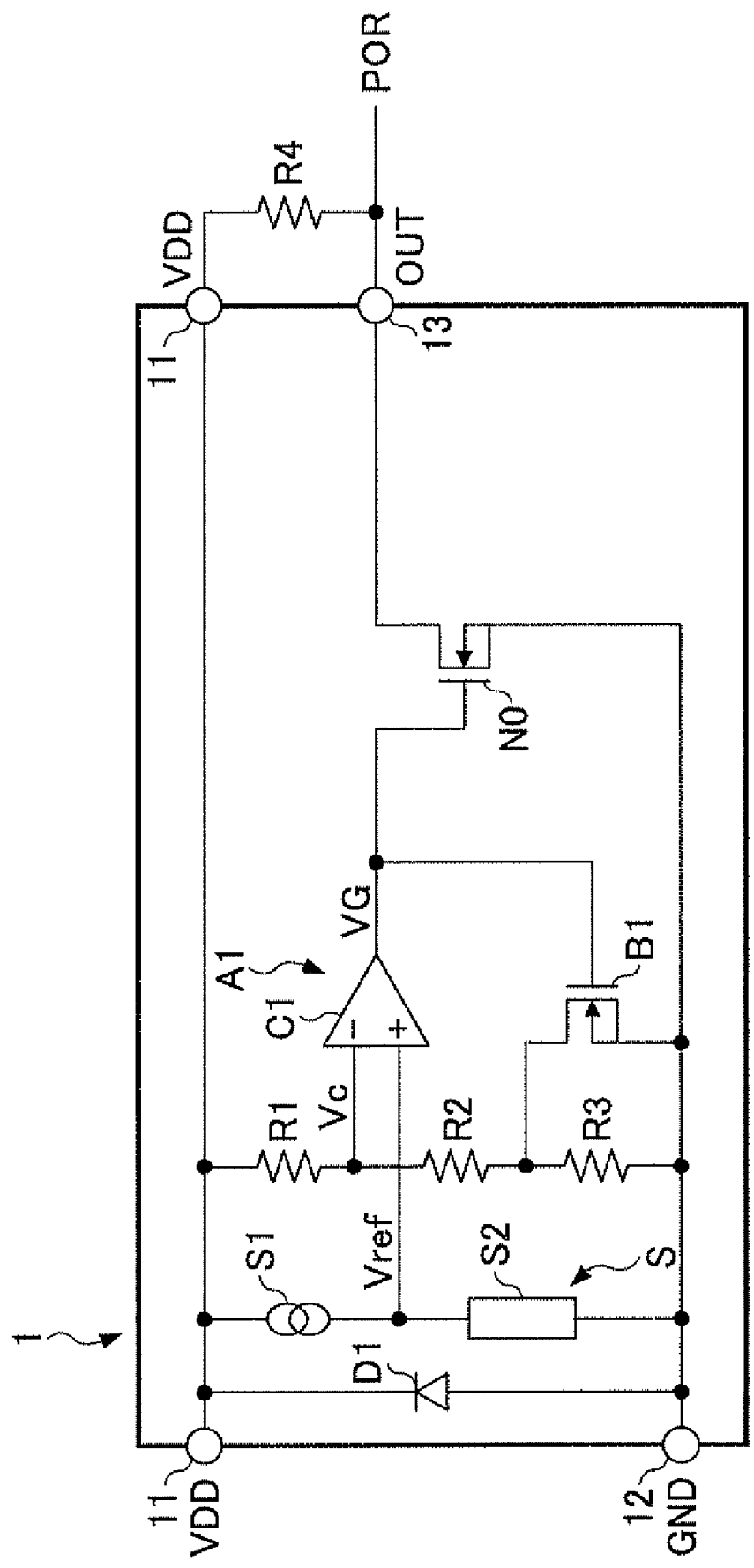
FIG. 1 is a schematic diagram illustrating a reset circuit according to a related art example.
Figure 5:
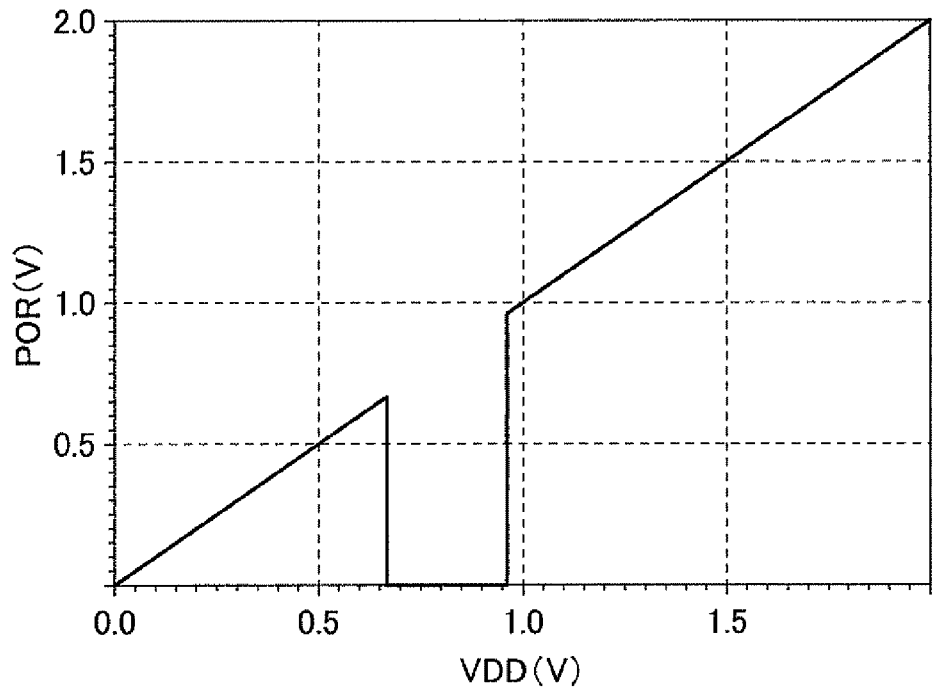
FIG. 5 is a graph for describing a relationship between a power supply voltage and a voltage level FOR of the reset circuit of FIG. 1.
Figure 6:
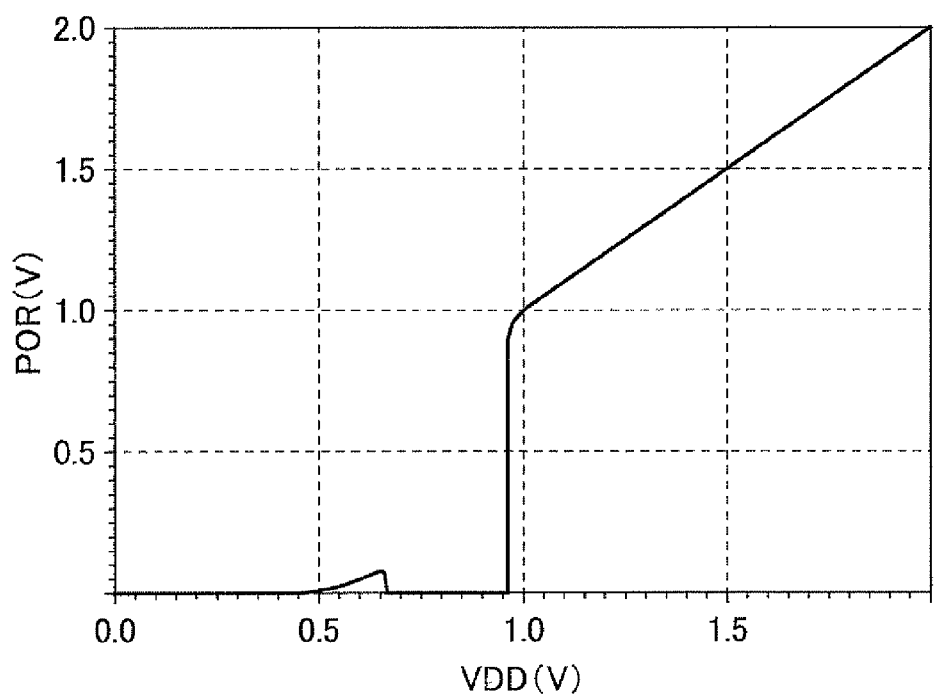
FIG. 6 is a graph for describing a relationship between a power supply voltage and a voltage level POR of the reset circuit of FIG. 3.

FIG. 5 is a graph for describing a relationship between a power supply voltage and a voltage level POR of the reset circuit of FIG. 1. FIG. 6 is a graph for describing a relationship between a power supply voltage and a voltage level POR of the reset circuit of FIG. 3. By comparing the graphs of FIGS. 5 and 6, it can be understood that the reset circuit 4 according to an embodiment of the present invention can maintain the voltage level POR at a low level in a case where the power supply voltage VDD is in an ultra-low voltage state.

For example, in a case of a microcomputer having an operating voltage of 1 V, the microcomputer determines that a resetting state is terminated when a voltage level POR having a voltage equal to or more than (0.8×VDD) is determined as a high level. Further, the microcomputer determines that a resetting state is maintained when a voltage level POR having a voltage equal to or less than (0.2×VDD) is determined as a low level. With the microcomputer having such specifications, it is desired for the voltage level POR to be low and maintain a reset state in a case where the power supply voltage VDD is 0.6 V.

With the reset circuit 1 according to the related art example, the microcomputer determines that the voltage level POR is a high level because the voltage level POR is 0.6 V when the power supply voltage VDD is 0.6 V. Therefore, the microcomputer determines that the reset state is terminated (see FIG. 5). With the reset circuit 4 according to an embodiment of the present invention, the microcomputer determines that the voltage level POR is a low level because the voltage level POR has a voltage equal to or less than (0.2×VDD) when the power supply voltage VDD is 0.6 V. Therefore, the microcomputer does not determine that the reset state is terminated (see FIG. 6).

Figure 7:
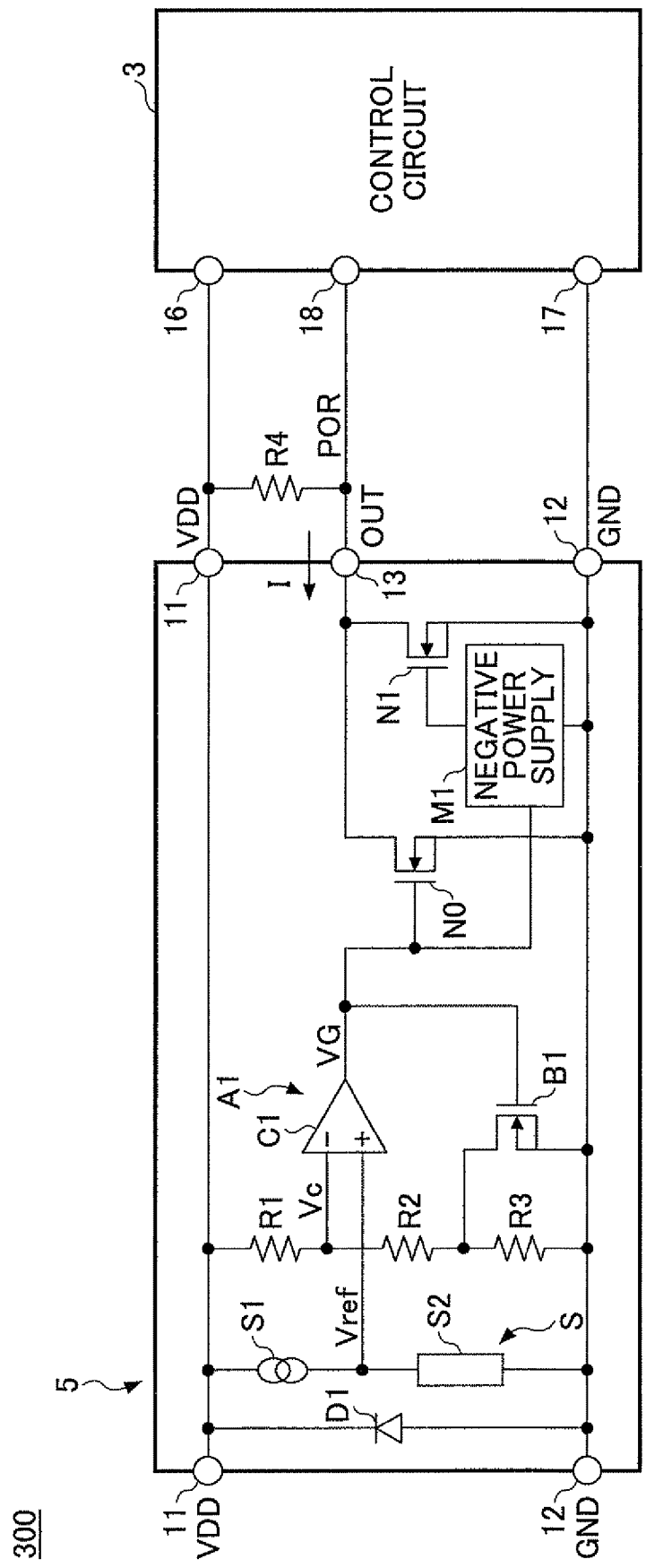
FIG. 7 is a schematic diagram illustrating a control apparatus including a reset circuit according to another embodiment of the present invention.

The reset circuit according to an embodiment of the present invention is not limited to the reset circuit 200 illustrated in FIG. 3. FIG. 7 is a schematic diagram illustrating a control apparatus 300 including a reset circuit 5 according to an embodiment of the present invention. The reset circuit 5 includes a negative power supply M1 being used as the block circuit A3 of FIG. 2. The negative power supply M1 controls the voltage between the gate of the transistor N1 and the source of the transistor N1 so that the voltage, between the gate of the transistor N1 and the source of the transistor N1 becomes a negative value no greater than a predetermined value. Thereby, the negative power supply M1 blocks the current I from sinking to the transistor N1. For example, in a case where the power supply voltage VDD is in a low voltage state (including ultra-low voltage state) requiring no blocking of the current I, the gate of the transistor N1 and the source of the transistor N1 may be short-circuited by the ground terminal 12.

The control apparatus 100 illustrated in FIG. 2 may be, for example, a DC-DC converter (e.g., boost regulator). For example, the control circuit 3, which is operable even when the power supply voltage VDD is in an ultra-low voltage state, can be effectively used in a boost control circuit that controls the boosting of the power supply voltage.

Hence, with the above-described embodiments of the present invention, a reset state of a reset target (e.g., control circuit, CPU) can be prevented from being erroneously terminated even in a case where the power supply voltage is in an ultra-low voltage state.

Further, the present invention is not limited to these embodiments, but variations and modifications may be made without departing from the scope of the present invention.

The present application is based on Japanese Priority Application No. 2010-166955 filed on Jul. 26, 2010, with the Japanese Patent Office, the entire contents of which are hereby incorporated by reference.

What is claimed is:

1. A reset circuit for resetting and terminating the resetting of a reset target, the reset circuit comprising:
   an n-channel metal-oxide-semiconductor field-effect transistor (MOSFET);
   a gate drive circuit configured to switch a drain voltage of the n-channel MOSFET from a low level to a high level when a power supply voltage exceeds a predetermined threshold;
   a sink circuit configured to maintain the drain voltage at the low level by sinking a current flowing from a drain side of the n-channel MOSFET; and
   a block circuit configured to block the current sinking to the sink circuit when the power supply voltage is exceeding the predetermined threshold;
   wherein the low level indicates a state where the reset target is in a reset state and the high level indicates a state where the reset state of the reset target is terminated.

2. The reset circuit as claimed in claim 1, wherein the gate drive circuit includes a comparator configured to compare the power supply voltage and the predetermined threshold and output a signal indicating a result of comparing the power supply voltage and the predetermined threshold, wherein the block circuit is configured to block the current sinking to the sink circuit according to the signal output from the comparator.

3. The reset circuit as claimed in claim 1, wherein the sink circuit includes a depletion type n-channel MOSFET that can sink the current, wherein the depletion type n-channel MOSFET has a gate-source voltage no greater than 0.

4. The reset circuit as claimed in claim 3, wherein the block circuit is configured to block the current sinking to the depletion type n-channel MOSFET by increasing a source potential of the depletion type n-channel.

5. A control apparatus comprising:
   a control circuit; and
   the reset circuit as claimed in claim 1 configured to perform resetting on the control circuit;
   wherein the reset circuit is configured to terminate the resetting when the drain voltage of the n-channel MOSFET is switched to the high level.

6. A microcomputer comprising:
   a central processing unit (CPU); and
   the reset circuit as claimed in claim 1 configured to perform resetting on the CPU;
   wherein the reset circuit is configured to terminate the resetting when the drain voltage of the n-channel MOSFET is switched to the high level.

* * * * *